United States Patent [19]

Fujita et al.

[11] Patent Number: 4,677,630
[45] Date of Patent: Jun. 30, 1987

[54] OSCILLATION FREQUENCY STABILIZED SEMICONDUCTOR LASER

[75] Inventors: Toshihiro Fujita, Toyonaka; Satoshi Ishizuka, Hirakata; Katsuyuki Fujito, Higashiosaka; Hisanao Sato, Ibaraki, all of Japan

[73] Assignee: Matsushita Electric Industrial Co., Ltd., Osaka, Japan

[21] Appl. No.: 671,469

[22] Filed: Nov. 14, 1984

[30] Foreign Application Priority Data

Nov. 18, 1983 [JP] Japan ................................ 58-218114

[51] Int. Cl.⁴ ............................................. M01S 3/13
[52] U.S. Cl. ...................................... 372/32; 372/26; 372/50; 372/92
[58] Field of Search ...................... 372/32, 29, 26, 33, 372/92, 50

[56] References Cited

FOREIGN PATENT DOCUMENTS 0111391 7/1983 Japan ..................................... 372/92
0111383 6/1984 Japan ..................................... 372/12

OTHER PUBLICATIONS

Heckscher et al, Flashlight-Size External Cavity Semiconductor Laser with Narrow-Linewidth Tunable Output", *Applied Optics*, Jan. 1975, vol. 14, pp. 94–96.

*Primary Examiner*—James W. Davie
*Attorney, Agent, or Firm*—Stevens, Davis, Miller & Mosher

[57] ABSTRACT

A semiconductor laser generating no intensity noise caused by reflected light and oscillating at a single frequency, wherein a cavity resonator is disposed externally of the semiconductor laser in order to suppress the oscillation frequency shift (chirping) of the semiconductor laser possibly induced with current modulation of the same.

10 Claims, 31 Drawing Figures

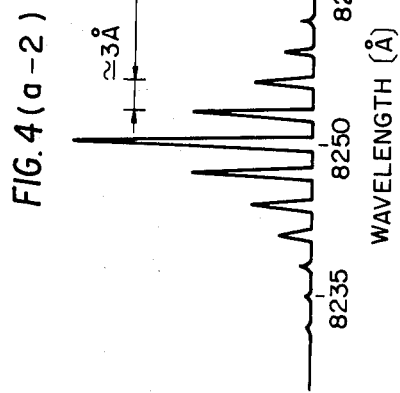
FIG. 4(a-2)
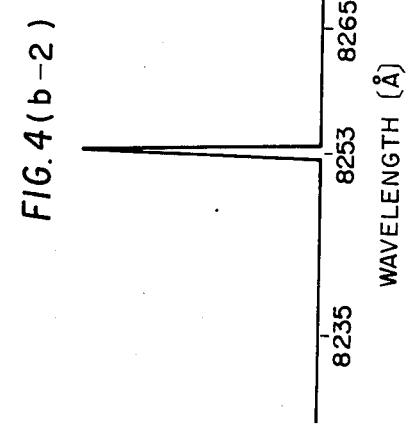
FIG. 4(b-2)
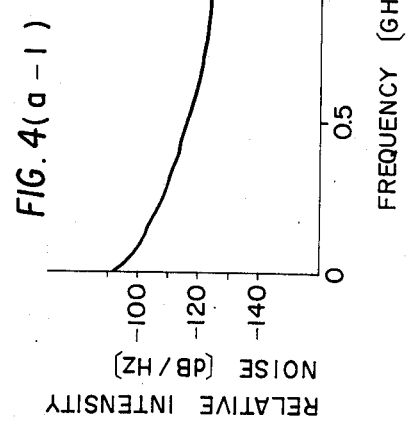
FIG. 4(a-1)
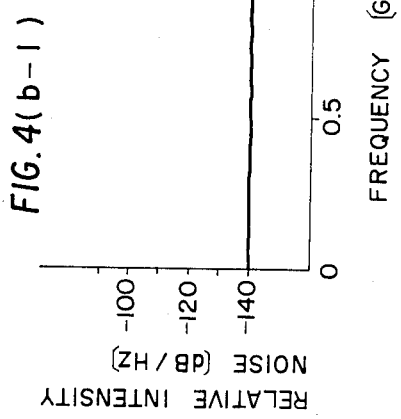
FIG. 4(b-1)

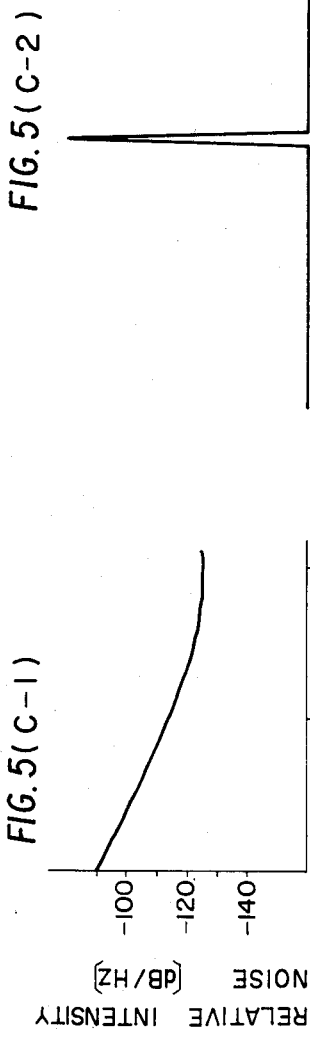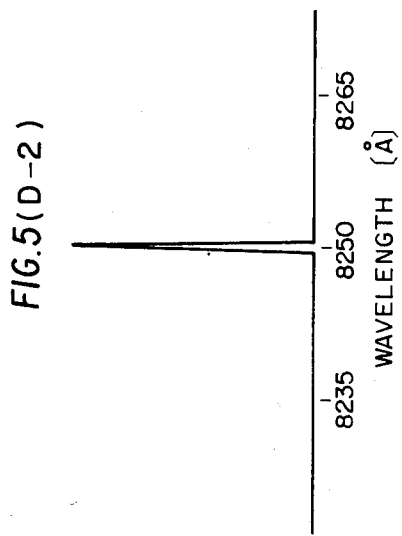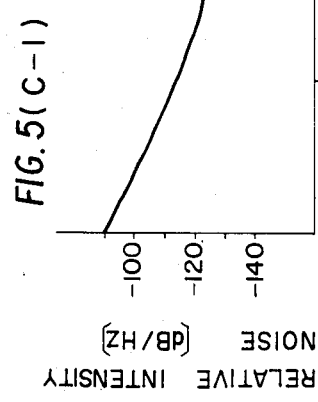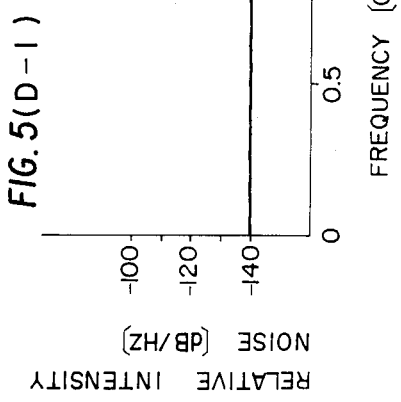
FIG.5(C-1) FIG.5(C-2) FIG.5(D-1) FIG.5(D-2)

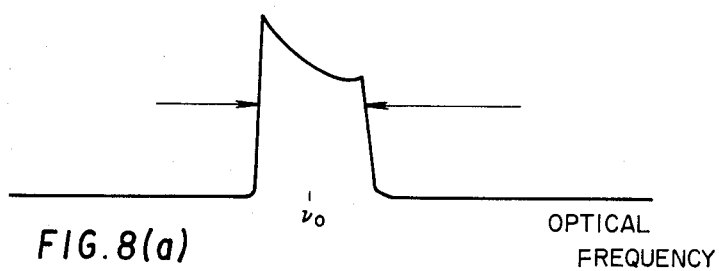
FIG.8(a)    $\nu_0$    OPTICAL FREQUENCY
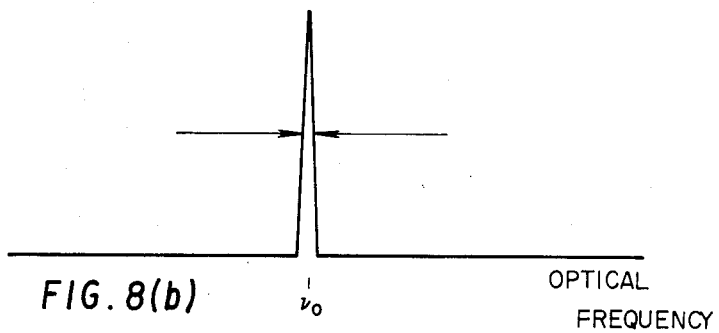
FIG.8(b)    $\nu_0$    OPTICAL FREQUENCY

OSCILLATION FREQUENCY STABILIZED SEMICONDUCTOR LASER

BACKGROUND OF THE INVENTION

The present invention relates to a technology for improving the characteristics of a semiconductor laser with an external cavity, in which intensity noise is not generated and the oscillation frequency shift or chirping associated with current modulation can be suppressed.

A remarkable improvement in the properties of a semiconductor laser has been made recently, such as reduction of threshold current, a high output power, a stabilized single lateral mode, and a stabilized single longitudinal mode. The semiconductor laser is widely applied not only to optical communication, but also to light sources for an optical sensor and an information processing system using e.g. an optical disk, and the like. There exists, however, a substantial problem in a semiconductor laser that the oscillation frequency or oscillation wavelength varies when the drive current of the semiconductor laser is modulated. The amount of oscillation frequency shift caused by the current modulation depends largely upon the semiconductor laser structure and the modulation frequency of modulation current.

FIG. 1 shows a typical example of such dependence, upon the modulation frequency fm, of the amount $\Delta\nu/\Delta I$ [Hz/mA] of oscillation frequency $\Delta_o$ shift of a semiconductor laser per unit current, when the solitary semiconductor laser is current modulated. The characteristic shown in the figure is one example obtained from a buried hetero-structure type semiconductor laser, and the detailed description thereof may be obtained from "Direct frequency modulation in AlGaAs semiconductor lasers", by S. Kobayashi et al. IEEE J. Quantum Electron., vol. QE-18, pp. 582–595, Apr. (1982).

As seen from the example shown in FIG. 1, when a modulation current is supplied to a laser, the oscillation frequency shift is generated which takes a minimum $\Delta\nu$ under the frequency of at about fm=50 MHz and $\Delta\nu/\Delta I=100$ MHz/mA. Under modulation at a lower frequency (fm<50 MHz), the oscillation frequency shift increases due to the refractive index change caused by the temperature change of an active layer of the semiconductor laser, and under modulation at a higher frequency (fm>50 MHz), the oscillation frequency shift increases due to the refractive index change caused by the fluctuation of carrier density.

The oscillation frequency shift may be effectively utilized if the semiconductor laser is used as a light source for frequency modulation, however, undesirable cases may often happen for some applications. For instance, in the long-haul optical communication for transmitting digital signals, the spectral line broadening due to the semiconductor laser modulation restricts the transmission distance or the transmission bandwidth. Further, in the transmission system wherein a semiconductor laser is coupled to a multi-mode optical fiber, the oscillation frequency modulation due to current modulation causes the increase of intensity noise, distortion, and so on. In an optical fiber sensor as well, a large fluctuation of the oscillation frequency may induce some problems such as noise.

It is understood from the above description that the laser oscillation frequency shift under intensity modulation by direct current modulation of a semiconductor laser is an extensively undesirable phenomenon, and this can be considered as one of the disadvantages of the semiconductor laser. Further, the oscillation frequency shift of the semiconductor laser is a phenomenon commonly presented even for a DFB (Distributed Feedback) laser and a DBR (Distributed Bragg Reflector) laser having a built-in diffraction grating structure. Thus, it is a problem of unavoidable kind no matter how stabilized the longitudinal single mode characteristic is.

Also known in the art is a semiconductor laser utilizing light fed back thereto, that is, a so-called coupled cavity structure semiconductor laser. The laser of this kind derives from an oscillation method selecting only a single longitudinal mode of a laser, which is described in "Mode suppression and single frequency operation in gaseous optical masers", by Kogelnik et al Proc. IRE pp. 2365–pp. 2366 (1962). A similar method thereto is also applied to a semiconductor laser. For example, as disclosed in "Short-coupled-cavity InGaAsP Injection Lasers for CW and high speed longitudinal mode operation", by C. Lin et al Electron Lett. vol. 19, pp. 561 (1983), a longitudinal single mode oscillation is realised, even under a high speed digital modulation, by mounting a reflective surface contiguous to the semiconductor laser.

A longitudinal single mode is attained by making L fairly smaller than an optical path length $\eta_1 l$ of a semiconductor laser chip, wherein l is the laser chip length and $\eta_1$ is a refractive index of an active layer of the laser, and L is the optical path length of an external cavity. In the above document, $L/\eta_1 l$ is $76/(3.6\times 83)\approx \frac{1}{4}$, and in other publications, $L/\eta_1 l$ is set within a range of $\frac{1}{3}$ to 1/6. Generally, even if $L/\eta_1 l$ is clearly stated, an optical feedback amount is not stipulated. The reason why the optical feedback amount is not definitely stated can be explained from the concept that a single mode oscillation is generated using a coincidence mode wherein the longitudinal mode spacing of a solitary laser matches with the longitudinal mode spacing of an external cavity mounted outside of the solitary laser. Therefore, no idea is found in the above structure for suppressing the laser oscillation frequency shift caused by a drive current modulation.

Other cases with the larger $L/\eta_1 l$ have been reported. For example, as described in "Spectral characteristics of semiconductor lasers with optical feedback", L. Goldberg et al, IEEE J. Quantum Electron., vol. QE-18, pp. 555–564, Apr. (1982), it has been pointed out that the longitudinal mode characteristic is turned to be a multi-mode one as the optical feedback amount increases, and that is desirable to perform an optical feedback with a small amount of light. The resultant structure has no concept to make the optical feedback large nor does it have the concept of drive current modulation. Therefore, no concept is found also in this structure for suppressing the laser oscillation frequency shift caused by a drive current modulation. The reason why the optical feedback amount of the semiconductor laser is generally indefinite, and the reason why it is reported that the smaller the optical feedback amount is, the more preferable, can be related to intensity noise generated when reflected light is fed back from the outside to the semiconductor laser.

It is known in the art that as reflected light is fed back to a semiconductor laser, the characteristics thereof are greatly influenced and it exhibits complicated characteristics. The feedback of reflected light induces such characteristics as increase of intensity noise of the semiconductor laser, change of longitudinal mode spectrum, non-linearity of current-light output characteristics, and the like, which represent obstacles for attainment of stabilization and high quality of the semiconductor laser. More particularly, the increase of intensity noise becomes a difficult problem in practice in the application where the semiconductor laser is used as a light source for optical communication in an analog transmission system or a coherent transmission system. In addition, the increase of intensity noise due to re-injection of reflected light has become a significant problem in the application where that the semiconductor laser is used as a light source for an information processing system employing e.g. an optical disk or a light source for an optical sensor.

It is considered that a semiconductor laser provided with an outside reflection surface is generally subject to a multi-mode oscillation as increase in the optical feedback amount from the reflection surface, and that intensity noise also increases. Numerically it is considered that multi-mode oscillation starts as the optical feedback amount exceeds more than 1 percent.

Thus, in order to reduce the influence of intensity noise increase due to feedback light to the semiconductor laser, measues such as the following are used:
(1) Insertion of optical isolator,
(2) Reflection coating of laser cleaved facets,
(3) Anti-Reflection coating of laser cleaved facets,
(4) Superposition of high frequency modulated signal, and
(5) Self-pulsation effect.

The former two (1) and (2) are methods for retaining such laser characteristics as a single longitudinal mode in longitudinal mode characteristics, and the latter three (3), (4), and (5) are methods for making the longitudinal mode characteristics those of a complete multi-mode. In any case it is considered better for the reflected light not to be returned back to the semiconductor laser.

SUMMARY OF THE INVENTION

The object of the present invention resides in that by additionally providing a cavity externally of a semiconductor laser and by setting the chip length, external cavity length, reflectivity of the external cavity, and preferably reflectivity of the laser cleaved facet within a certain range, the semiconductor laser can be made to stably oscillate in a longitudinal single mode without generating any intensity noise due to feedback of relfection light, and the oscillation frequency shift of the semiconductor laser associated with output intensity modulation in current modulation can be made small.

The structure of the semiconductor laser device according to the present invention comprises a laser made of a compound semiconductor and an optical element, the semiconductor laser having an optical path length $\eta_1 l$ with a refractive index $\eta_1$ of the active layer and a chip resonator length l, and an amplitude reflectivity $r_1$ of one of the chip resonator facets. The optical element is disposed externally of the laser at a position apart from the one of the facets by an optical path length L, and has a reflective function of an amplitude reflectivity $r_0$ so as to effectively define an optical feedback amount to the laser. And, by setting $L/\eta_1 l \geq 0.9$ and $r_0 \geq 0.1$, for example, the semiconductor laser driving current is modulated. The amplitude reflectivity may be $r_1 \leq 565$. An air layer may be provided between the laser chip resonator facet and the optical element with a reflective function, or alternatively added with a lens, or may be a medium having a refractive index $\eta_0$. These elements may be fabricated as a monolithic structure on a semiconductor substrate. Further, the optical element with a reflective function may be a plane mirror, a concave mirror, a plane diffraction grating, a concave diffraction grating, or a polyhedral mirror.

BRIEF DESCRIPTION OF THE DRAWINGS

FIG. 2 is a view diagrammatically illustrating parameters defined in the present invention, such as amplitude reflectively, cavity length and so on.

FIGS. 4a-1, a-2, b-1 and b-2 show intensity noise spectra obtained with a spectrum analyzer and longitudinal mode spectra obtained with a Zerny-Turner grating monochrometer, both observed in the experimental system of FIG. 3 using a mirror as an optical element having a reflective function.

FIGS. 5c-1, c-2, d-1 and d-2 intensity noise spectra obtained with a spectrum analyzer and longitudinal mode spectra obtained with a Zerny-Turner greating monochrometer, both observed in the experimental system of FIG. 3 using a diffraction grating as an optical element having a reflective function.

FIGS. 8a and b show a difference is the amount of oscillation frequency shift of a semiconductor laser under current modulation, without or with an external cavity.

DESCRIPTION OF THE PREFERRED EMBODIMENTS

Our detailed experiments and analyses which will be hereinafter described in detail have proved that even if an optical feedback amount is large, the semiconductor laser generates intensity noise not at all. Furthermore, in addition, it has been clarified how to minimize the oscillation frequency shift caused by current modulation, which is the concept of the present invention. More particularly, the concept of the present invention is basically different from the concept suppressing a relaxation oscillation which poses problems during high speed modulation by feeding back reflected light externally to the semiconductor laser. The concept has been analysed considering under what conditions of an external cavity coupled structure the oscillation frequency shift can be minimized, which shift is a prior art disadvantage of the semiconductor laser.

Our detailed investigation has been made upon the oscillation shift amount with respect to drive current modulation, DC current change, and laser mount temperature, by disposing an optical element with a reflective function externally of the semiconductor laser. Concurrently with the above, the longitudinal mode characteristics and intensity noise characteristics have also been observed. As a result, it has been found that however large the optical feedback amount is, the semiconductor laser does not generate intensity noise, and it oscillates with a single frequency. Moreover, we have made it clear for the first time that the laser oscillation frequency is stable even under current modulation and that it may be more effective if an appropriate cavity length of the external cavity and an appropriate reflectivity of the cavity are set.

Therefore, by using the semiconductor laser according to our invention, the prior art semiconductor problems can be substantially overcome, such as the problem of a large change of oscillation frequency due to current modulation, to produce an extensively improved semiconductor laser.

The embodiments of the present invention will be described with reference to the accompanying drawings.

Figure 1:
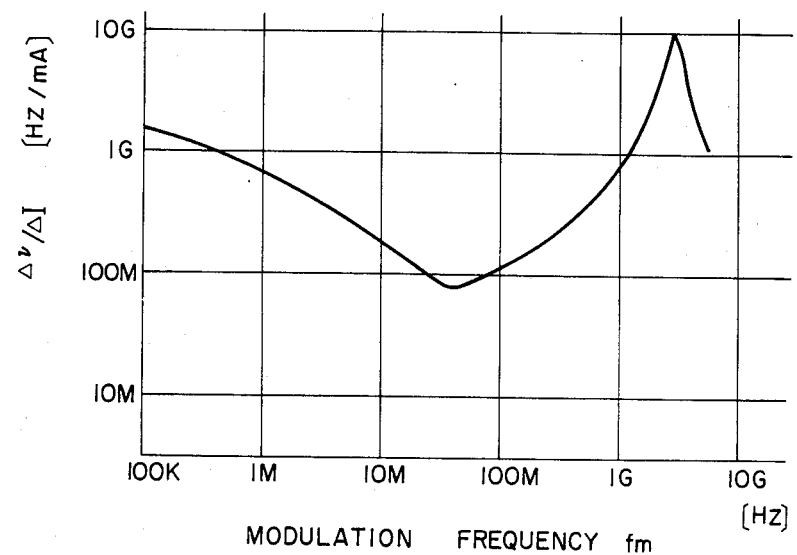
FIG. 1 is a graph showing a dependence upon modulation frequency of an oscillation frequency shift amount per unit modulation current of a solitary semiconductor laser.
Figure 2:
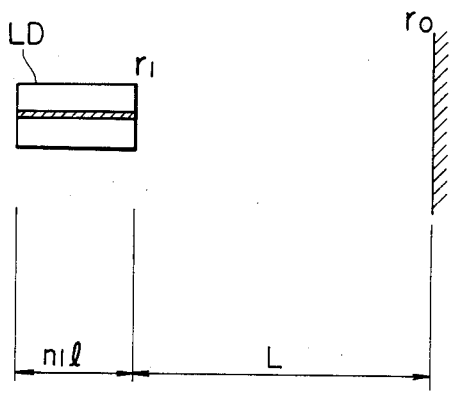
Figure 3:
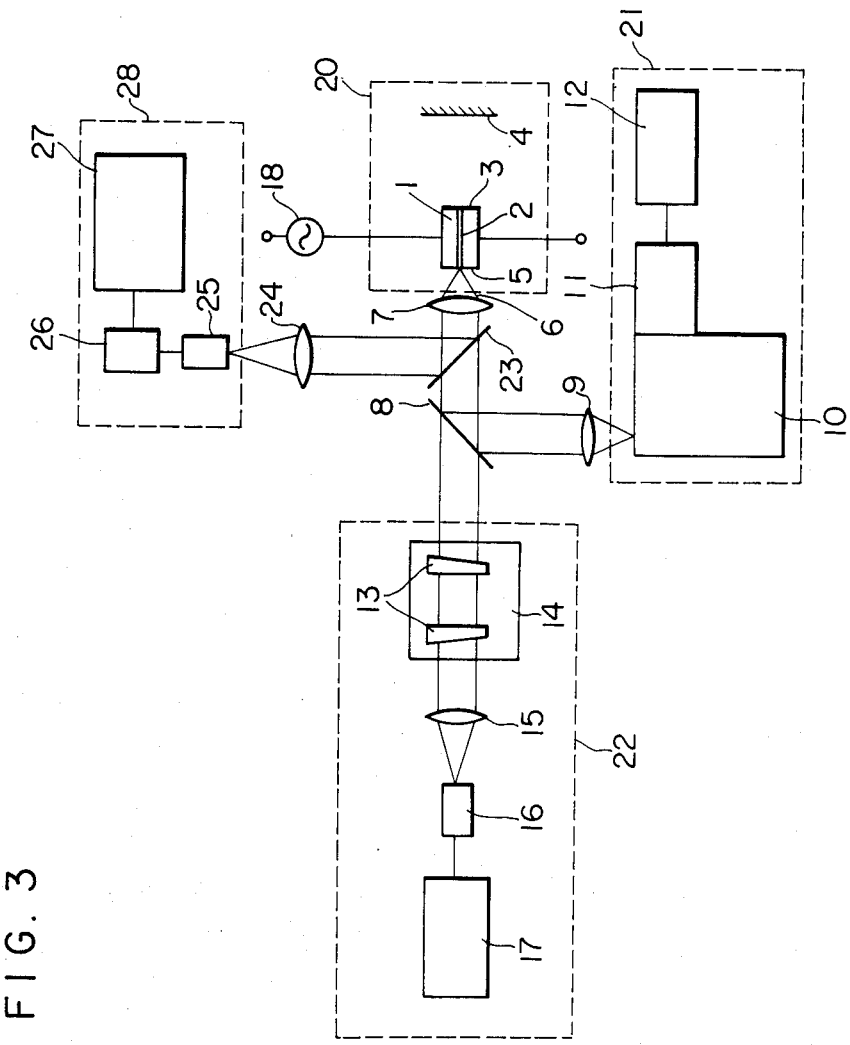
FIG. 3 is a diagram of an experimental system used for specifying the characteristics of the semiconductor laser according to the present invention.

The present inventors have been studying the characteristics of semiconductor lasers of various external cavity coupled structures. And as described above, on what conditions the oscillation frequency shift amount of the semiconductor laser under current modulation can be minimized has been pursued. The conditions here in question means, as shown in FIG. 2, varying an optical length L of an external cavity, an effective amplitude reflectivity $r_0$ taking into consideration the coupling from the external cavity to the active layer of the semiconductor laser, an optical path length $\eta_1 l$ of the semiconductor laser having an refractive index of $\eta_1$ and a chip length l, and an amplitude reflectivity $r_1$ at the semiconductor laser chip resonator cleaved facet on the side of the external cavity. That is, by varying $\eta_1 l$, L, $r_1$, $r_0$ in FIG. 2, the change of the oscillation frequency of the semiconductor laser light under current modulation has been analysed. FIG. 3 shows an experimental system for measurement.

A laser light within the active layer 2 of the semiconductor laser 1 is emitted from one facet 3 of the chip resonator cleaved facets, and is fed back again to the semiconductor laser active layer 2 from an optical element 4 with a reflective function acting as the external cavity resonator. In FIG. 3, reference numeral 20 generally denotes constitutional elements which are the same as those shown in FIG. 2. Laser light 6 emitted from the other facet 5 of the chip resonator cleaved facets is collimated with a lens 7, and a portion thereof is diverged with a beam splitter 8 to input to a Zerny-Turner grating monochrometer 10. The spectra are received by a Vidicon camera 11 mounted on an exit slit of the Zerny-Turner grating monochrometer, and the longitudinal mode is monitored by an oscilloscope 12. Other laser light diverted is passed through a Fabry-Perot interferometer 14 having two etalons 13 with high reflectivity, and collected with a lens 15 to input to a detector 16 for observation of the spectra by an oscilloscope 17. The Fabry-Perot interferometer 14 is of a piezo-scanning type, and has a resolution of 3 MHz at the maximum, with the etalon spacing being 50 cm. In other words, a broad spectral range is observed at an observation system 21, while a narrow spectral range is observed at an observation system 22.

Light diverted by a beam splitter 23 is received by an detector 25 so as to be amplified by an amplifier 26 for observation of intensity noise with a spectral analyzer 27. In other words, an observation system 28 observes a state of increase of intensity noise due to light reflected to the semiconductor laser.

The measurement results using an AlGaAs semiconductor laser are shown in the following. The measurement results using a mirror as an optical element 4 with a reflection function and setting an external cavity length L=15 mm are shown in FIG. 4. FIGS. 4(a-1) and (b-1) show intensity noise spectra measured at the observation system 28, and FIGS. 4(a-2) and (b-2) respectively corresponding to FIGS. 4(a-1) and (b-1) are longitudinal mode spectra measured at the observation system 21. In general, if reflected light is fed back to the semiconductor laser, it is reported that intensity noise increases, and FIG. 4(a-1) indicates this case. In this case, the longitudinal mode spectrum showed a multimode oscillation as shown in FIG. 4(a-2) with a mode spacing corresponding to the chip length $l \approx 300$ μm. However, according to our precise experiments, it has been found that by adjusting the optical phase of the feedback light relative to the emitted laser light, no intensity noise is generated at all as shown in FIG. 4(b-1) even if the optical feedback amount is large and the longitudinal mode oscillation can be attained in a single mode.

Furthermore, the measurement results using a diffraction grating as the optical element with a reflection function and setting the external cavity length L - 15 mm are shown in FIG. 5. FIGS. 5(C-1) and (D-1) show intensity noise spectra measured at the observation system 28, and FIGS. 5(C-2) and (D-2) show longitudinal mode spectra corresponding to (C-1) and (D-1) respectively and measured at the observation system 21. By using the diffraction grating as the optical element with a reflective function, it is easy to apparently select a single longitudinal chip mode, as shown in FIGS. 5(C-2) and (D-2). It is noted in this case that intensity noise spectra may sometimes increase greatly as shown in FIG. 5(C-1). However, by adjusting the feedback light phase relative to the light emitted from the laser, it is possible to have a state where intensity noise is not generated in the least as shown in FIG. 5(D-1) even with a significantly large optical feedback amount.

Figure 6A:
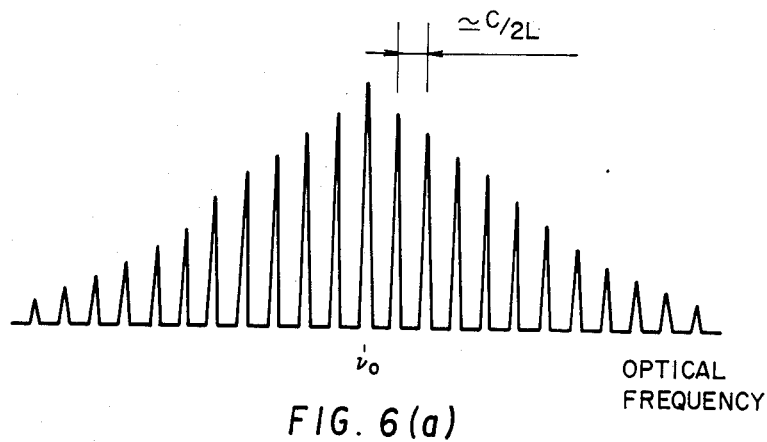
FIGS. 6a and b show longitudinal mode spectra obtained with a Fabry-Perot interferometer and observed in the experimental system of FIG. 3.
Figure 6B:
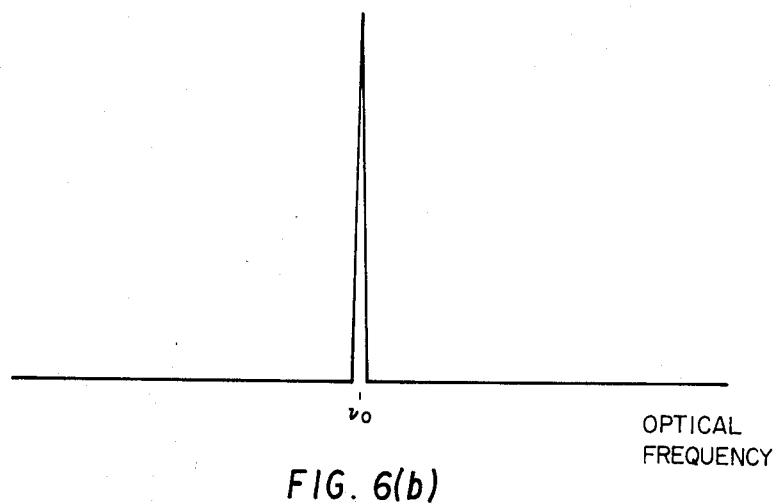

It has been proved that the longitudinal mode spectra measured at the observation system 22 are quite different, respectively for the case with increase of intensity noise or for the case without generation of intensity noise in the least, regardless of whether a mirror or a diffraction grating is used for the optical element with a reflective function. FIG. 6 shows a fine structure of longitudinal mode spectra measured at the observation system 22, that is, with the Fabry-Perot interferometer. In the case where intensity noise caused by reflected light increases, the semiconductor laser always oscillates in several external cavity modes as shown in FIG. 6(a), and in the case where intensity noise is entirely suppressed, it has proved that the oscillation is per-formed in a purely single external cavity mode as shown in FIG. 6(b). Therefore, it is understood that intensity noise generated while reflected light is fed back to the semiconductor laser, is related to the light beatings between external cavity modes. A detailed description relating to intensity noise is here omitted. By changing either a feedback amount or an external cavity length, it is possible to realize a pure single frequency oscillation without generating reflection noise in the least. The characteristics of the semiconductor laser under such a pure single frequency oscillation is described hereinafter.

Figures 7A, 7B:
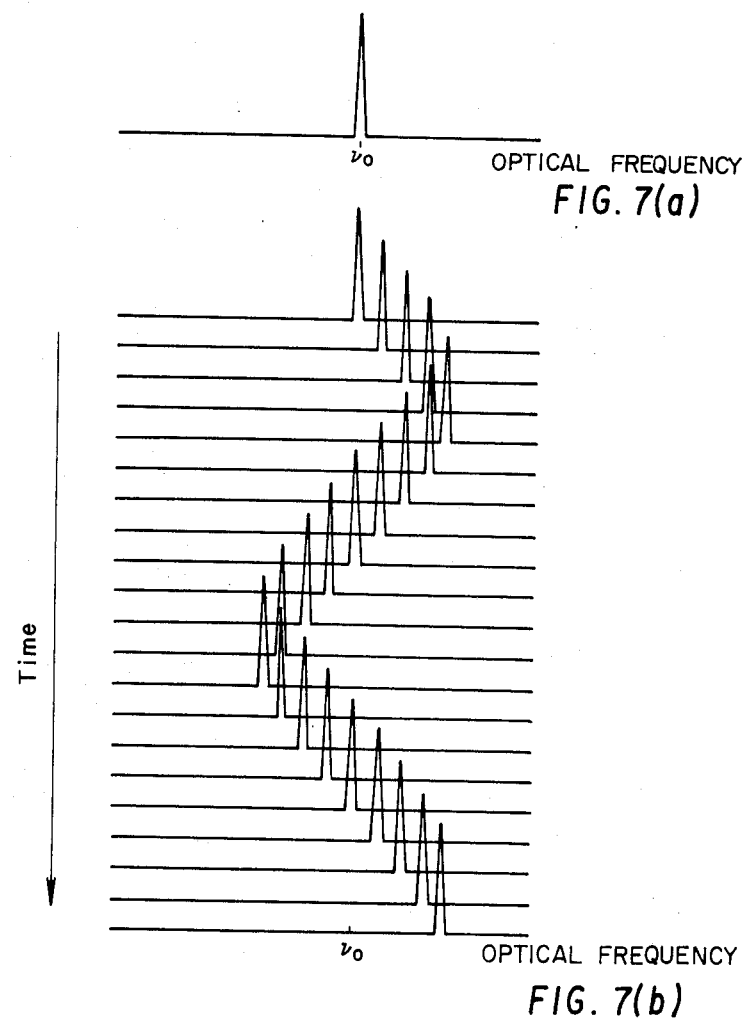
FIGS. 7a and b are graphs showing a temporal change of the laser oscillation frequency caused by current modulation of a semiconductor laser.

The oscillation frequency of the semiconductor laser is constant while it is driven by a DC drive current as shown in FIG. 7(a), but on the other hand the oscillation frequency changes in a time domain as shown in FIG. 7(b) while a drive current is under modulation. This is, the oscillation frequency shift has an apparent laser spectrum spread.

Longitudinal mode spectra are shown in FIGS. 8(a) and (b) which are observed at the observation system 22 while the semiconductor laser 1 in the experimental system of FIG. 3 is supplied with a modulation current 18. FIG. 8(a) stands for the case without the external cavity, while FIG. 8(b) stands for the case with the external cavity. In both cases, constant amplitude sine-wave currents were used for modulation at a modulation frequency of 100 MHz. As seen from the figures, the oscillation frequency shift (chirping) due to the modulation is smaller in (b) than in (a).

It has been proved for the first time from our analysis that the amount of the shift depends largely upon the cavity length and the reflectivity of the cavity facets. In the following, the description is made concerning under what conditions the amount of oscillation frequency shift can be suppressed under current modulation.

Figure 9A:
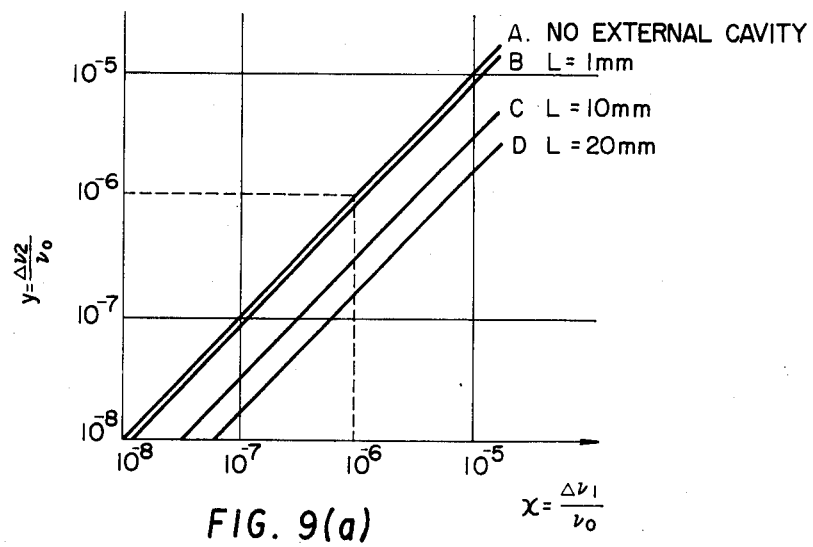
FIGS. 9a and b show dependence of the suppression amount of the oscillation frequency shift upon the external cavity length.

It is assumed here that the amount of a laser oscillation frequency shift per a certain modulation current $\Delta I$ is $\Delta \nu_1$ for a case without the external cavity and $\Delta \nu_2$ for a case with the external cavity. Using the laser oscillation frequency $\nu_0$ and defining $x = \Delta \nu_1 / \nu_0$ and $y = \Delta \nu / \nu_0$, then, it follows that the smaller $y/x = \Delta \nu_2 / \Delta \nu_1$, the shift amount of the semiconductor laser oscillation frequency $\nu_0$ becomes smaller. In other words, $y/x$ represents a suppression degree of the oscillation frequency shift. In the case of an AlGaAs semiconductor laser, since the oscillation frequency is $\nu_0 = 3.57 \times 10^{14}$ HZ, x becomes $x = 10^{-6}$ while the shift amount $\Delta \nu_1$ of the oscillation frequency per modulation current $\Delta I$ is for example 357 MHz. FIG. 9 shows the states under various external cavity lengths L under the particular conditions that a chip length of the semiconductor laser $l = 300$ μm, an amplitude reflectivity of the cleaved facet $r_1 = 0.565$ ($r_1^2 = 0.32$), and an amplitude reflectivity defining an effective optical feedback amount to the semiconductor layer $r_0 = 0.7$ ($r_0^2 = 0.49$). The effective amplitude reflectivity $r_0$ defines the optical amount practically fed back and coupled to the semiconductor laser, and can be adjusted with attenuators or the like. FIG. 9(a) shows a relation between $\Delta \nu_1$ and $\Delta \nu_2$. Character (A) stands for a case without the external cavity, and characters (B) through (D) stand for cases with the external cavities whose lengths are respectively (B)L=1 mm, (C)L=10 mm, and (D)L=20 mm. It is seen that for the modulation at $x = 10^{-6}$ for example, y becomes $y = 10^{-6}$ for the case (A) without the external cavity, while y for the cases (B) through (D) is gradually suppressed the larger L becomes.

Figure 9B:
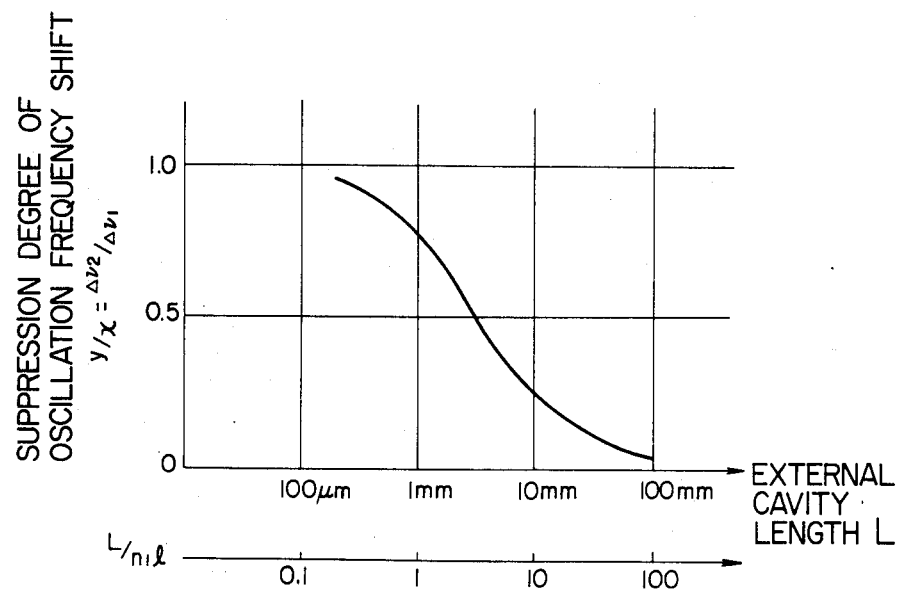

The suppression degree y/x of the oscillation frequency, with L changed more minutely, is shown in FIG. 9(b). It is seen that the larger L is, y/x can be made smaller.

FIG. 9(b) shows the state where L is changed under the condition that the semiconductor laser chip length l is 300 μm. Our analysis for further chip lengths ranging from 50 μm to 500 μm has proved that substantially similar suppression degree of the oscillation frequency shift can be obtained irrespective of the chip length so long as the relation $L/\eta_1 l$ is equal. That is, the value of y/x for L=3 mm and the chip length l=300 μm is substantially equal to the value y/x for L=2 mm and the chip length l=200 μm. Such a state is hereinafter discussed using as a parameter the ratio $L/\eta_1 l$ of an optical path length of the external cavity to an optical path length of the semiconductor laser chip, as shown in FIG. 9(b).

FIG. 9 has been used for the states where the effective amplitude reflectivity $r_0$ of the external cavity is 0.7, and the following description is for the states where $r_0$ is changed as a parameter.

Figure 10:
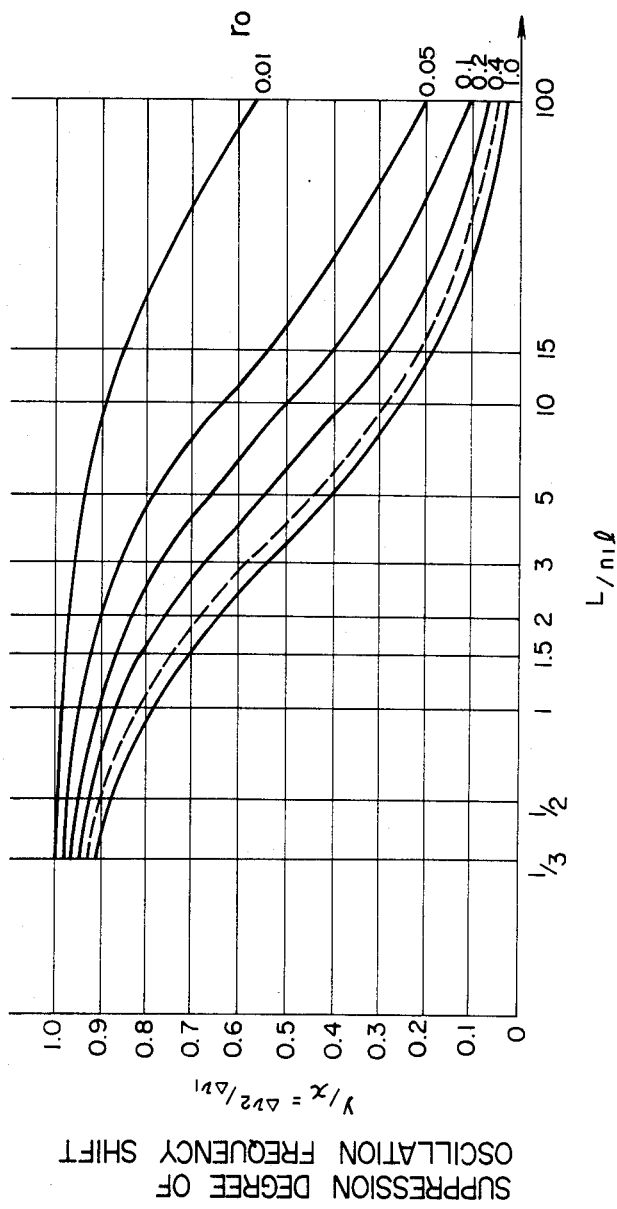
FIGS. 10 and 11 show a dependence of the suppression amount of the oscillation frequency shift upon $r_0$ defining the optical feedback amount and the cavity length ratio $L/\eta_1 l$.

FIG. 10 shows the results of analysis in which $r_0$ is used as a parameter for the suppression degree $\Delta \nu_2 / \Delta \nu_1$ of the oscillation frequency shift relative to $L/\eta_1 l$. It is seen from the figure that the larger the L is, and larger the $r_0$, the value of $\Delta \nu_2 / \Delta \nu_1$ becomes smaller.

Figure 11:
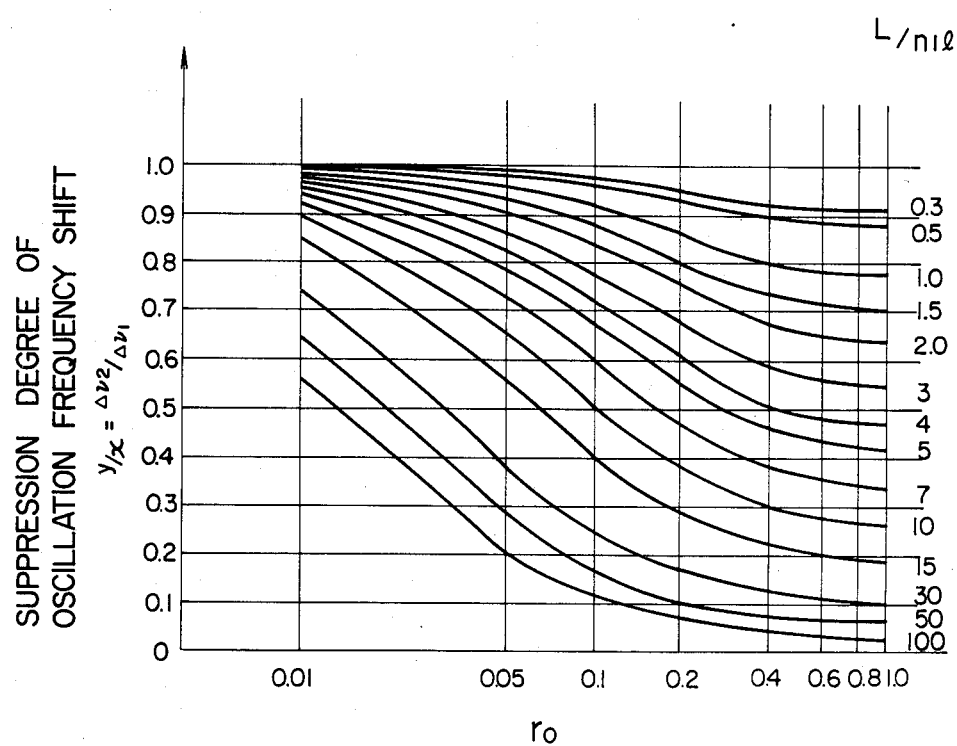

FIG. 11 is a graph showing more minutely, using $L/\eta_1 l$ as a parameter, the ratio $\Delta \nu_2 / \Delta \nu_1$ relative to the external cavity amplitude reflectivity $r_0$ of FIG. 10.

From FIGS. 10 and 11, it is possible to obtain a relation between $r_0$ and $L/\eta_1 l$ for a particular suppression degree $\Delta \nu_2 / \Delta \nu_1$ of the oscillation frequency. The results are shown in FIG. 12.

Figure 12:
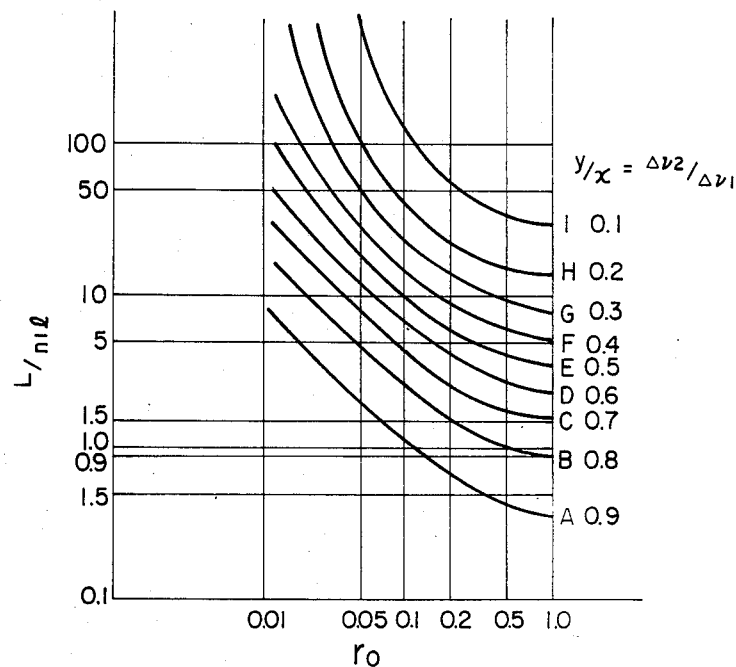
FIG. 12 shows a relation between $r_0$ and $L/\eta_1 l$ relative to the suppression degree of the oscillation frequency shift.

In FIG. 12, the values of $L/\eta_1 l$ and $r_0$, which suffices the selectively determined value of ratio $\Delta \nu_2 / \Delta \nu_1$ of the oscillation frequency suppression under modulation, are shown using contour lines. For example, the contour line A shows a relation between $L/\eta_1 l$ and $r_0$ for $\Delta \nu_2 / \Delta \nu_1 = 0.9$, and another contour line E shows a relation between $L/\eta_1 l$ and $r_0$ for $\Delta \nu_2 / \Delta \nu_1 = 0.5$.

By virtue of the analysis by the present inventors, it is seen that the attainment of a desired suppression of the oscillation frequency shift may be done by setting $L/\eta_1 l$ and $r_0$ within a certain limited range.

As described above, the present inventors have measured the suppression degree of the oscillation frequency shift, and concurrently therewith have observed the C/N and distortion characteristics while the semiconductor laser is subject to current modulation or particularly to analog modulation. The results show that the characteristics are improved while the oscillation frequency shift is suppressed, and that it is more effective while $\Delta \nu_2 / \Delta \nu_1$ is lower than 0.8 or more preferably lower than 0.7. Further improvement is attained while $\Delta \nu_2 / \Delta \nu_1$ is made smaller. Thus, the reduction of the shift amount of the oscillation frequency of the semiconductor laser under modulation, can be made by setting the factors of the external cavity within the certain numerical ranges. The important aspect of the present invention is therefore featured by the practical range of $r_0 \geq 0.1$ and $L/\eta_1 l \geq 0.9$ which retains a suppressing effect of the oscillation frequency shift, more preferably in the range of $r_0 \geq 0.2$ and $L/\eta_1 l 24$ 1.5.

In addition, the present inventors have observed that the oscillation frequency shift of the semiconductor laser light is suppressed still more by the provision of an anti-reflection coating to the cleaved facet of the semiconductor laser chip resonator.

Figure 13:
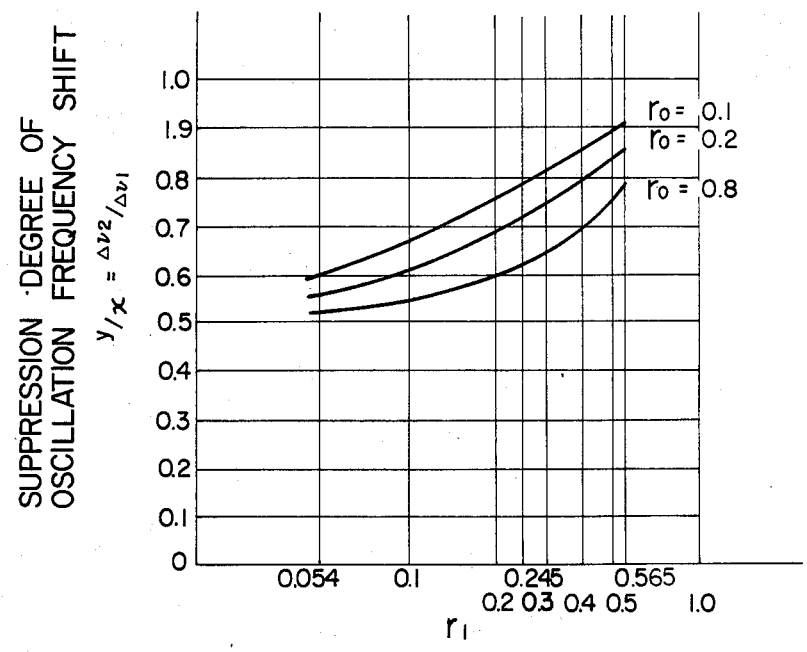
FIG. 13 shows a dependence of the suppression degree of oscillation frequency shift upon the amplitude reflectivity $r_1$ of the laser chip resonator facet.

FIG. 13 shows the suppression degree $\Delta\nu_2/\Delta\nu_1$ of the oscillation frequency shift wherein $r_0$ is changed at a constant value of $L/\eta_1 l = 1$ and the reflectivities $r_1$ at the cleaved facet are $r_1=0.505$ ($r_1^2=0.32$), $r_1=0.245$ ($r_1^2=0.06$), $r_1=0.054$ ($r_1^2=0.003$), respectively. As is apparent from the graph, it is seen that the smaller $r_1$ for $L/\eta_1 l$ and $r_0$ can suppress more readily the oscillation frequency shift amount of the semiconductor laser light under modulation.

Figure 14:
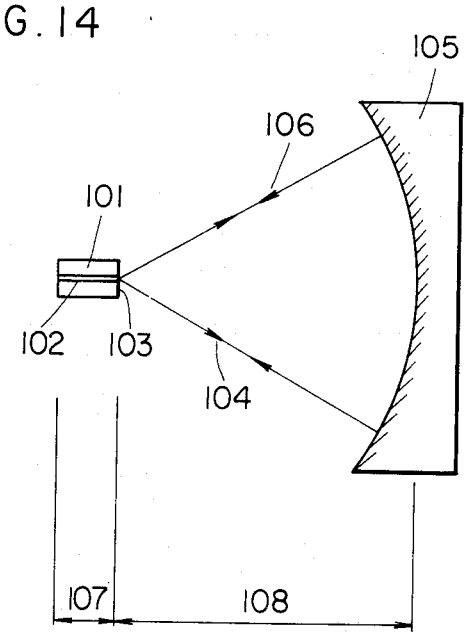
FIGS. 14 through 21 are partial front views of particular embodiments of the present invention.

More concrete embodiments according to the present invention are described hereinafter. First and second embodiments employ air between the cleaved facet of the semiconductor laser chip resonator and the optical element with a reflective function. The first embodiment is shown in FIG. 14. In the embodiment, laser light 104 emitted out of the resonator facet 103 of the semiconductor laser 101 including an active layer 102, is reflected at the concave mirror 105 as an optical element with a reflection function, and the reflected light 106 is fed back to the semiconductor laser 101. According to the present invention, determined are the chip length 107 of the semiconductor laser, the refractive index of the active layer 102, the amplitude reflectivity of the concave mirror 105 taking into consideration of the feedback coupling to the semiconductor laser, the amplitude reflectivity of the chip resonator facet 103, and the distance of air layer between the facet 103 and the concave mirror 105.

Figure 15:
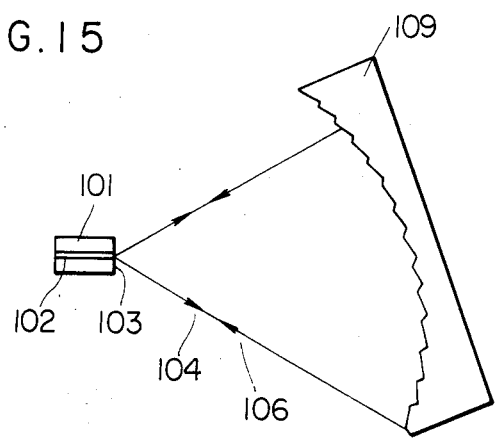

The second embodiment is shown in FIG. 15. The embodiment employs a concave grating 109 instead of the concave mirror 105 shown in FIG. 14. With the grating, it is very effective in that particularly wavelength selectivity can be enhanced. In addition, the effective amplitude reflectivity can be made large by making astigmatism small.

Figure 16:
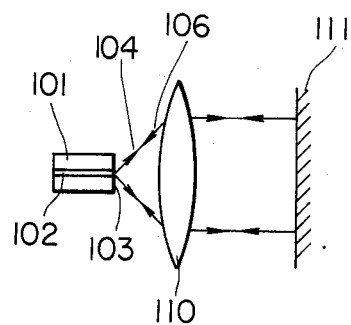
Figure 17:
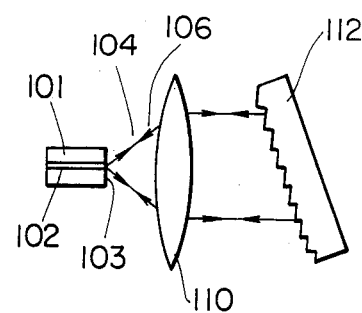
Figure 18:
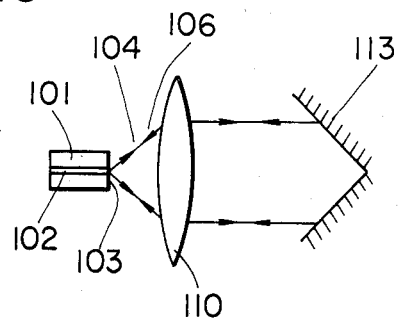

The third through fifth embodiments are shown respectively in FIGS. 16 through 18. These embodiments employ a lens between the cavity facet of the semiconductor laser and the optical element with a reflection function.

In the third embodiment shown in FIG. 16, laser light 104 emitted out of the chip resonator facet 103 of the semiconductor laser 101 including the active layer 102, passes through a lens 110, and is reflected at a plane mirror 111 as an optical element with a reflective function, and passes again through the lens 110, and the reflected light 106 is fed back to the semiconductor laser 101.

The fourth embodiment shown in FIG. 17 employs a plane grating 112 instead of the plane mirror 111 of FIG. 6.

The fifth embodiment shown in FIG. 18 employs a polyhedral mirror 113 instead of the plane mirror 111 of FIG. 16.

Figure 19:
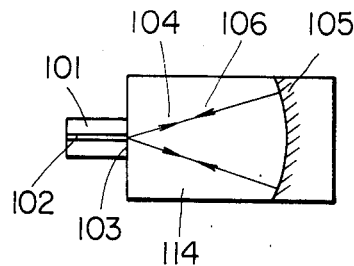
Figure 20:
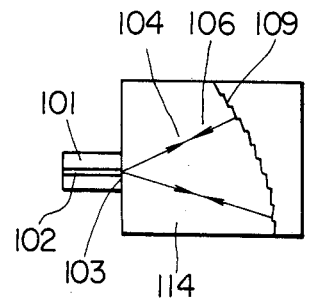

The sixth and seventh embodiments are shown in FIGS. 19 and 20 respectively. These embodiments employ a medium having the refractive index $n_0$ and filled between the facet of the semiconductor laser and the optical element with a reflective function. The integrated arrangement can also make the mechanical structure stable.

In the sixth embodiment shown in FIG. 19, laser light 104 emitted out of the facet 103 of the semiconductor laser 101 including the active layer 102, transmits through the medium 114 such as glass or dielectric block, is reflected at the concave mirror 105, and the reflected light 106 is fed back to the semiconductor laser 101.

The seventh embodiment shown in FIG. 20 employs a concave grating 109 instead of the concave mirror 105 of FIG. 19.

Figure 21:
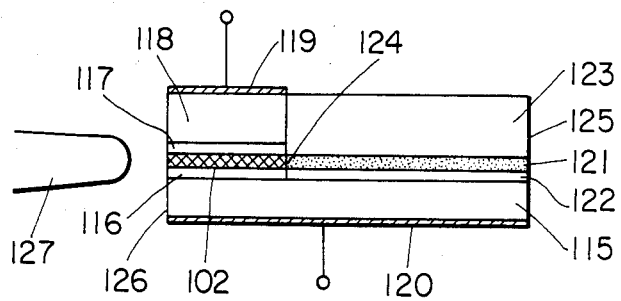

An eighth embodiment is shown in FIG. 21. The embodiment employs a medium having the refractive index $\eta_0$ and filled between the facet of the semiconductor laser and the optical element with a reflective function. More particularly, the medium having the refractive index $\eta_0$ is used as a semiconductor waveguide in which the semiconductor laser, the optical element with a reflective function, and the medium therebetween are integrated as a single chip on the same substrate. The single chip integration or a monolithic structure can enjoy a stable operation and an extradordinarily small dimension.

More in detail, the semiconductor laser and the semiconductor waveguide is made in integrated structure, in which the laser portion on a semiconductor substrate 115 comprises a cladding layer 116, an active layer 102, a cladding layer 117, a buffer layer 118, and electrodes 119 and 120, and in which the semiconductor waveguide portion on the same semiconductor substrate 115 comprises a waveguide 121, cladding layers 122 and 123 for the waveguide 121. A coupling portion 124 between the waveguide 121 and the semiconductor laser corresponds to the semiconductor laser facet, and the optical element with a reflection function corresponds to a face 125 of the semiconductor waveguide 121. The face may be provided with a reflection coating.

Various integrated arrangements of the semiconductor laser and the semiconductor waveguide may be employed other than the eighth embodiment. The eighth embodiment exemplarily shows a light source for optical fiber communication in which an optical fiber 127 is disposed outwardly of another facet 126 of the semiconductor laser.

The coupling of the semiconductor laser to the optical fiber is not limited to only the eighth embodiment, but it may also be applied to any other type of the semiconductor laser. Further, the semiconductor laser is not limited to GaAlAs lasers, but it may also be applied to an InP type light emitting device of 1 $\mu$m range or other devices of wavelength range other than 1 $\mu$m.

Furthermore, the structure of the semiconductor laser is not limited to the above embodiments, but any other structures may be used for the semiconductor laser.

As seen from the above description, our analysis has clarified for the first time the following fact: the oscillation frequency shift of the semiconductor laser under current modulation can be minimized, which the conventional laser cannot accomplish, by providing an optical element with a reflection function to the semiconductor laser, and by properly setting the semiconductor laser chip length, external cavity length, amplitude reflectivity of the semiconductor laser facet, effectively definable amplitude reflectivity of the optical element with a reflection function, that is, by setting $L/\eta_1 l \geq 0.9$, and $r_0 \geq 0.1$, $r_1 \leq 0.565$. It is considered further that the semiconductor laser according to the present invention is very effective in practical usage since intensity noise due to the reflected light is generated not at all, and that it is particularly useful for improvement of the characteristics thereof under analog modulation.

It is noted that although there is known a method for increasing the modulation speed by suppressing a relaxation oscillation of the semiconductor laser by means of optical feedback using a mirror provided adjacent to the outside of the semiconductor mirror, the object of the present invention as disclosed above is quite different from such heretofore method.

The features of the present invention can advantageously be applied in reducing the wavelength dispersion effect in a longhaul optical fiber communication for a digital signal transmission which uses a digital signal as a modulation signal instead of an analog signal, to a local oscillator or signal source in a coherent optical transmission system, in reducing flickers of a speckle pattern in a multi-mode optical fiber system, and to various light sources for optical information processing system or optical sensor.

We claim:

1. A semiconductor laser device comprising:

a semiconductor laser element having (i) an active layer with an optical path length defined by $n_1 l$ where $n_1$ is a refractive index of the active layer and $l$ is a length of the active layer and (ii) cladding layers which are formed on upper and lower surfaces of said active layer, said semiconductor laser element having resonating surfaces at opposite end surfaces;

electrodes formed on surfaces of said cladding layers for applying a driving current to said active layer so that laser beams are generated from said opposite end surfaces of said active layer;

modulating means for modulating said driving current to modulate an intensity of said laser beams, so that an oscillation frequency of said semiconductor laser element is altered;

reflecting means for reflecting one of said laser beams back to said semiconductor laser element, said reflecting means having a reflecting surface disposed near one of said opposite end surfaces of said semiconductor laser element spaced apart from one of said resonating surfaces a distance defining an optical path length $L_1$ between said reflecting surface and said one of said resonating surfaces, said reflecting surface having an amplitude reflectivity $r_0$; and said active layer and said reflecting means being defined by the relationships of $L_1/n_1 l \geq 0.9$ and $r_0 \geq 0.1$ to suppress alteration of said oscillation frequency.

2. A semiconductor laser device according to claim 1, wherein said one of said resonating surfaces has an amplitude reflectivity $r_1$ which is $\leq 0.565$.

3. A semiconductor laser device according to claim 1, wherein an air layer is provided between said one of said resonating surfaces and said reflecting surface.

4. A semiconductor laser device according to claim 2, wherein a lens is disposed between said one of said resonating surfaces and said reflecting surface.

5. A semiconductor laser device according to claim 1, wherein a medium having a refractive index 0 is filled between said one of said resonating surfaces and said reflecting surface.

6. A semiconductor laser device according to claim 3, wherein said laser element and said reflecting means are integrally formed on a same semiconductor substrate.

7. A semiconductor laser device according to claim 1, wherein said reflecting means comprises a mirror.

8. A semiconductor laser device according to claim 1, wherein said reflecting means comprises a grating.

9. A semiconductor laser device accoding to claim 1, wherein said reflecting means comprises a polyhedral mirror.

10. A semiconductor laser device according to claim 1, wherein said drive current is an analog signal.

* * * * *